(12) United States Patent
Jung et al.

(10) Patent No.: US 11,041,909 B2
(45) Date of Patent: Jun. 22, 2021

(54) FIXING DEVICE FOR SECONDARY BATTERY TEST

(71) Applicant: LG CHEM, LTD., Seoul (KR)

(72) Inventors: Bum Young Jung, Daejeon (KR); Byung Soo Kim, Daejeon (KR); Yong Min Lee, Daejeon (KR); Il Hyoung Joung, Daejeon (KR); Kyu Rak Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 123 days.

(21) Appl. No.: 16/465,897

(22) PCT Filed: Jul. 10, 2018

(86) PCT No.: PCT/KR2018/007824
§ 371 (c)(1),
(2) Date: May 31, 2019

(87) PCT Pub. No.: WO2019/013535
PCT Pub. Date: Jan. 17, 2019

(65) Prior Publication Data
US 2019/0302187 A1    Oct. 3, 2019

(30) Foreign Application Priority Data

Jul. 11, 2017    (KR) .................. 10-2017-0087843
Jul. 5, 2018    (KR) .................. 10-2018-0078398

(51) Int. Cl.
*G01R 31/382*    (2019.01)
*H01M 10/42*    (2006.01)
(Continued)

(52) U.S. Cl.
CPC .......... *G01R 31/382* (2019.01); *B25B 11/002* (2013.01); *H01M 10/425* (2013.01);
(Continued)

(58) Field of Classification Search
None
See application file for complete search history.

(56) References Cited

U.S. PATENT DOCUMENTS

| 9,246,377 B2 | 1/2016 | Fukasawa et al. |
| 10,026,536 B2 | 7/2018 | Hegenbart et al. |

(Continued)

FOREIGN PATENT DOCUMENTS

| DE | 102015119434 A1 | 5/2017 |
| EP | 2040241 A1 | 3/2009 |

(Continued)

OTHER PUBLICATIONS

International Search Report (PCT/ISA/210) issued in PCT/KR2018/007824, dated Oct. 23, 2018.

(Continued)

*Primary Examiner* — Roy Y Yi
(74) *Attorney, Agent, or Firm* — Birch, Stewart, Kolasch & Birch, LLP

(57) ABSTRACT

A fixing device for a secondary battery test having a seating stage on which the secondary battery to be tested is seated and which is provided as a magnetic body, a cover provided as a magnetic body to cover the secondary battery, and a magnetic force generator providing magnetic force to the seating stage and the cover is provided. When the magnetic force is transmitted from the magnetic force generator to the seating stage and the cover, attractive magnetic force is generated between the cover and the seating stage to fix the secondary battery disposed between the cover and the seating stage without moving.

19 Claims, 9 Drawing Sheets

(51) Int. Cl.
*H01M 10/44* (2006.01)
*H01M 10/48* (2006.01)
*B25B 11/00* (2006.01)

(52) U.S. Cl.
CPC ....... *H01M 10/4285* (2013.01); *H01M 10/44* (2013.01); *H01M 10/48* (2013.01)

(56) References Cited

U.S. PATENT DOCUMENTS

| | | |
|---|---|---|
| 10,451,682 B2 | 10/2019 | Lim et al. |
| 2015/0188399 A1 | 7/2015 | Fukasawa et al. |
| 2015/0221914 A1* | 8/2015 | Page ................... H01M 2/1016 429/82 |
| 2016/0256963 A1 | 9/2016 | Hwang |
| 2017/0133139 A1 | 5/2017 | Hegenbart et al. |
| 2018/0074131 A1 | 3/2018 | Lim et al. |

FOREIGN PATENT DOCUMENTS

| | | |
|---|---|---|
| EP | 3264514 A1 | 1/2018 |
| JP | 61-280735 A | 12/1986 |
| JP | 2006-134599 A | 5/2006 |
| JP | 2012-215537 A | 11/2012 |
| JP | 2016-219267 A | 12/2016 |
| KR | 10-2001-0109588 A | 12/2001 |
| KR | 10-2013-0067782 A | 6/2013 |
| KR | 10-2014-0015647 A | 2/2014 |
| KR | 10-2015-0078173 A | 7/2015 |
| KR | 10-2016-0051044 A | 5/2016 |
| KR | 10-2016-0107704 A | 9/2016 |
| KR | 10-2016-0131271 A | 11/2016 |
| KR | 10-2017-0030356 A | 3/2017 |

OTHER PUBLICATIONS

Extended European Search Report for European Application No. 18831175.7, dated Sep. 30, 2019.

* cited by examiner

FIXING DEVICE FOR SECONDARY BATTERY TEST

CROSS-REFERENCE TO RELATED APPLICATION

The present application claims the benefit of the priority of Korean Patent Application Nos. 10-2017-0087843, filed on Jul. 11, 2017, and 10-2018-0078398, filed on Jul. 5, 2018, which are hereby incorporated by reference in their entirety.

TECHNICAL FIELD

The present invention relates to a fixing device for a secondary battery test.

BACKGROUND ART

Secondary batteries are rechargeable unlike primarily batteries, and also, the possibility of compact size and high capacity is high. Thus, recently, many studies on secondary batteries are being carried out. As technology development and demands for mobile devices increase, the demands for secondary batteries as energy sources are rapidly increasing.

Secondary batteries are classified into coin type batteries, cylindrical type batteries, prismatic type batteries, and pouch type batteries according to a shape of a battery case. In such a secondary battery, an electrode assembly mounted in a battery case is a chargeable and dischargeable power generating device having a structure in which an electrode and a separator are stacked.

The electrode assembly may be approximately classified into a jelly-roll type electrode assembly in which a separator is interposed between a positive electrode and a negative electrode, each of which is provided as the form of a sheet coated with an active material, and then, the positive electrode, the separator, and the negative electrode are wound, a stacked type electrode assembly in which a plurality of positive and negative electrodes with a separator therebetween are sequentially stacked, and a stack/folding type electrode assembly in which stacked type unit cells are wound together with a separation film having a long length.

Most secondary batteries comprising such pouch-type batteries have undergone many related tests during battery testing in the development process of the secondary batteries.

For example, when a nail penetration test of a secondary battery is performed, the secondary battery may move while the nail passes through the secondary battery, and thus, it may be difficult to accurately perform the nail penetration test.

FIG. 1 is a plan view illustrating a measured portion of a secondary battery that is used for a nail penetration test.

When a penetration test of a secondary battery 10 according to the related art is performed, lifting may occur at a No. 7 position when a nail passes through a No. 3 position of the secondary battery 10. Here, secondary short circuit may occur due to movement such as the lifting of the secondary battery 10 to significantly deteriorate reliability of the penetration test of the secondary battery 10.

DISCLOSURE OF THE INVENTION

Technical Problem

One aspect of the present invention is to provide a fixing device for a secondary battery test, which is capable of preventing the secondary battery from moving when the secondary battery is tested.

Technical Solution

A fixing device for a secondary battery test according to an embodiment of the present invention comprises a seating stage configured to seat a secondary battery to be tested, the seating stage being a magnetic body, a cover configured to cover the secondary battery when seated on the seating stage, the cover being a magnetic body, and a magnetic force generator providing magnetic force to the seating stage and the cover, wherein, when the magnetic force is transmitted from the magnetic force generator to the seating stage and the cover, attractive magnetic force is generated between the cover and the seating stage such that the cover and the seating stage are capable of fixing the secondary battery between the cover and the seating stage such that the secondary battery does not move relative to the seating stage.

Advantageous Effects

According to the present invention, the secondary battery may be fixed to be prevented from moving when the secondary battery is tested, thereby improving the test reliability.

Also, according to the present invention, the secondary battery between the cover and the stage may be fixed through the attractive magnetic force between the cover and the stage, which receive the magnetic force from the magnetic force generator. Thus, the movement of the secondary battery, which occurs when the nail passes through the secondary battery during the nail penetration test, may be effectively prevented from occurring to improve the reliability of the nail test.

Furthermore, since the secondary battery disposed between the cover and the stage is fixed through the attractive magnetic force between the cover and the stage, the secondary battery having the various shapes and sizes may be easily fixed without being damaged.

MODE FOR CARRYING OUT THE INVENTION

Figure 1:
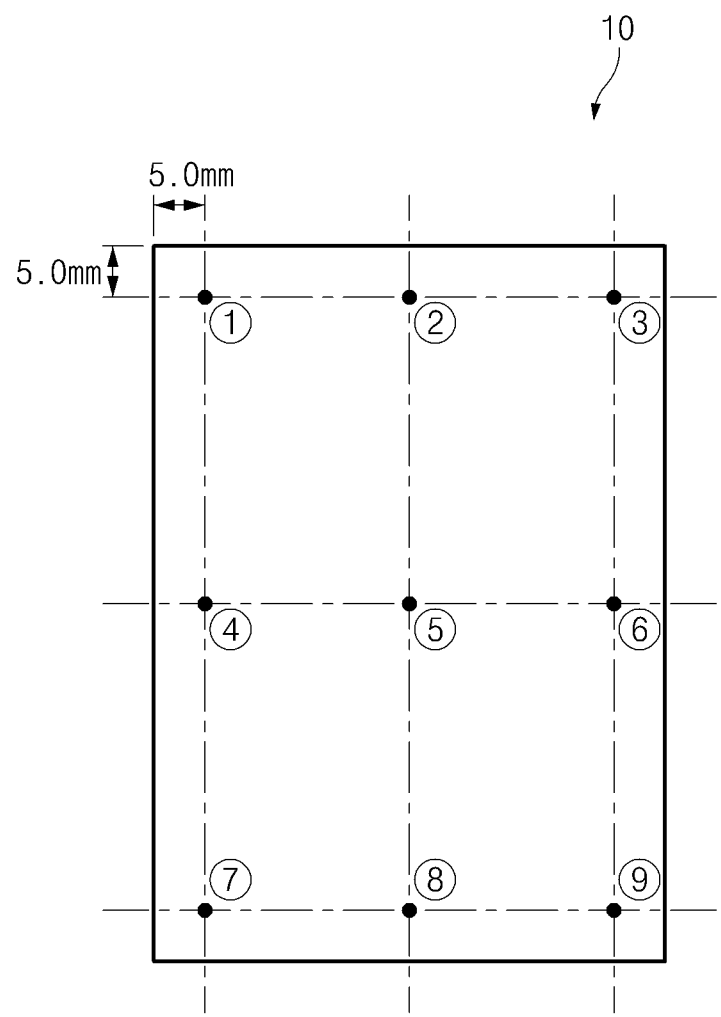
FIG. 1 is a plan view illustrating a measured portion of a secondary battery that is used for a nail penetration test.

The objectives, specific advantages, and novel features of the present invention will become more apparent from the following detailed description taken in conjunction with the accompanying drawings. It should be noted that the reference numerals are added to the components of the drawings in the present specification with the same numerals as possible, even if they are illustrated in other drawings. Also, the present invention may be embodied in different forms and should not be construed as limited to the embodiments set forth herein. In the following description of the present invention, the detailed descriptions of related arts which may unnecessarily obscure the gist of the present invention will be omitted.

Figure 2:
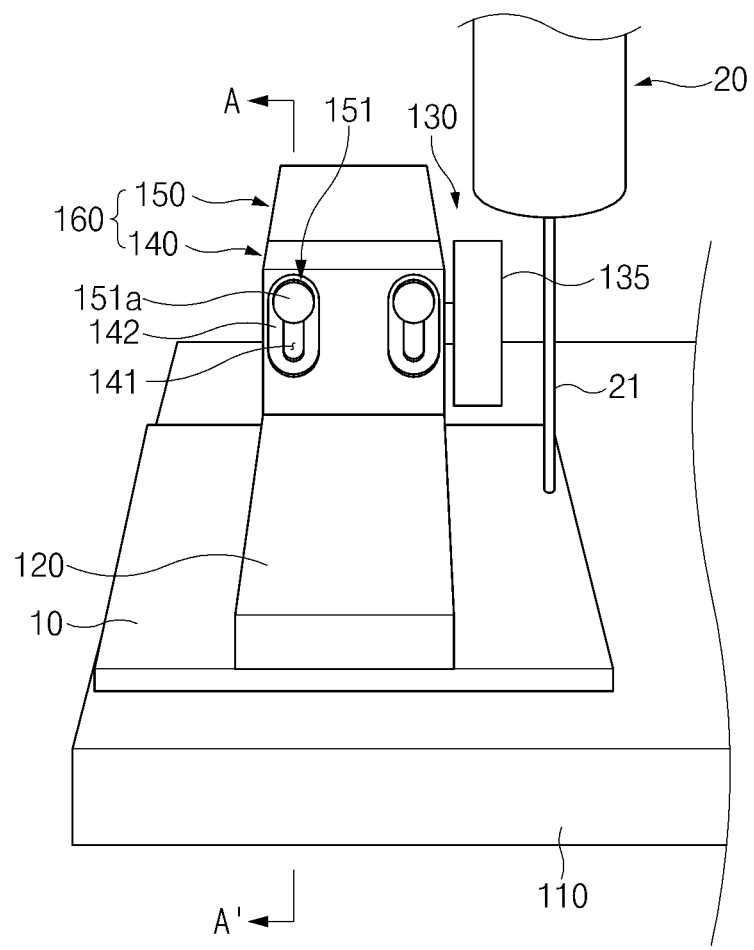
FIG. 2 is a conceptual front view perspective view of a fixing device for a secondary battery test according to an embodiment of the present invention.
Figure 3:
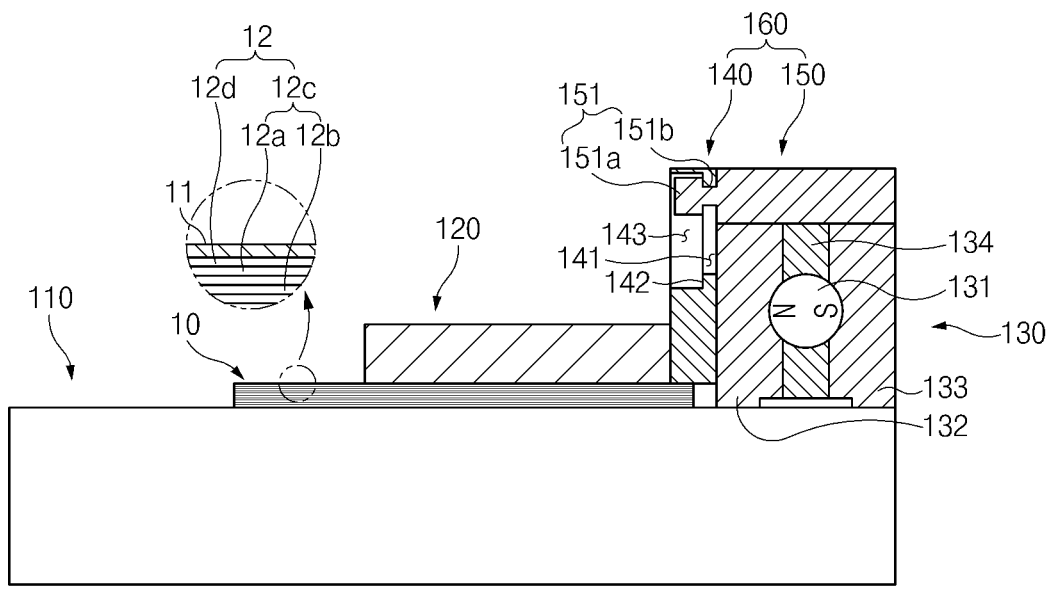
FIG. 3 is a cross-sectional view taken along line A-A' of FIG. 1.

FIG. 2 is a conceptual front view perspective view of a fixing device for a secondary battery test according to an embodiment of the present invention, and FIG. 3 is a cross-sectional view taken along line A-A' of FIG. 1.

Referring to FIGS. 2 and 3, a fixing device 100 for a secondary battery test according to an embodiment of the present invention comprises a seating stage 110 on which a secondary battery 10 is seated, a cover 120 covering the secondary battery 10, and a magnetic force generator 130 providing magnetic force to the seating stage 110 and the cover 120 and fixes the secondary battery 10 so as not to move. The fixing device 100 for the secondary battery test according to an embodiment of the present invention may further comprise a vertical moving unit 160 for allowing the cover 120 to be coupled to be vertically movable.

Hereinafter, the fixing device for the secondary battery test according to an embodiment of the present invention will be described in detail with reference to FIGS. 2 to 7.

Referring to FIG. 3, for example, the secondary battery 10 to be tested by using the fixing device for the secondary battery test may comprise a battery case 11 having an accommodation space therein and an electrode assembly 12 accommodated in the accommodation space of the battery case 11.

The electrode assembly 12 may be a chargeable and dischargeable power generation element and have a structure in which an electrode 12c and a separator 12d are combined and alternately stacked.

The electrode 12c may comprise a positive electrode 12a and a negative electrode 12b. Here, the electrode assembly 12 may have a structure in which the positive electrode 12a/the separator 12d/the negative electrode 12b are alternately stacked. Here, the separator 12d may be disposed between the positive electrode 12a and the negative electrode 12b and also disposed outside the positive electrode 12a and outside the negative electrode 12b. Here, the separator 12d may be disposed to surround the entire electrode assembly 12 in which the positive electrode 12a/the separator 12d/the negative electrode 12b are stacked.

The separator 12d is made of an insulation material to electrically insulate the positive electrode 12a from the negative electrode 12b. Here, the separator 12d may be made of, for example, a polyolefin-based resin film such as polyethylene or polypropylene having micropores.

The seating stage 110 may have a planar seating surface to seat the secondary battery 10 for the test thereon. Here, the seating stage 110 may have, for example, a rectangular block shape.

Also, the seating stage 110 may be provided as a magnetic body. Here, the seating stage 110 may be provided as a ferromagnetic body made of a metal material. Here, the seating stage 110 may comprise one or more of iron (Fe), nickel (Ni), or cobalt (Co).

The cover 120 may be provided as a magnetic body covering the secondary battery 10. Here, the cover 120 may be provided as a ferromagnetic body made of a metal material. Here, the cover 120 may comprise one or more of iron (Fe), nickel (Ni), or cobalt (Co).

Also, the cover 120 may have, for example, a rectangular block shape.

Figure 4:
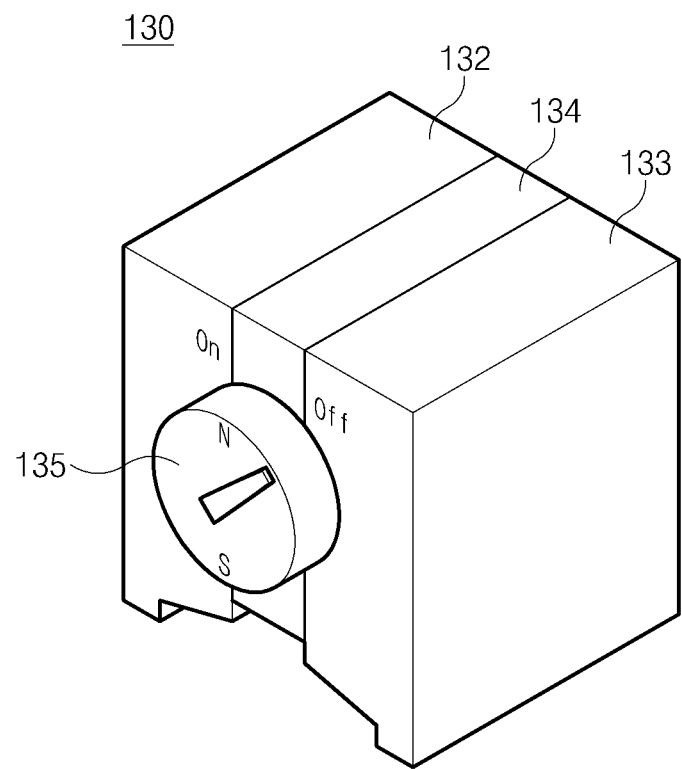
FIG. 4 is a perspective view of a magnetic force generator in the fixing device for the secondary battery test according to an embodiment of the present invention.
Figure 5:
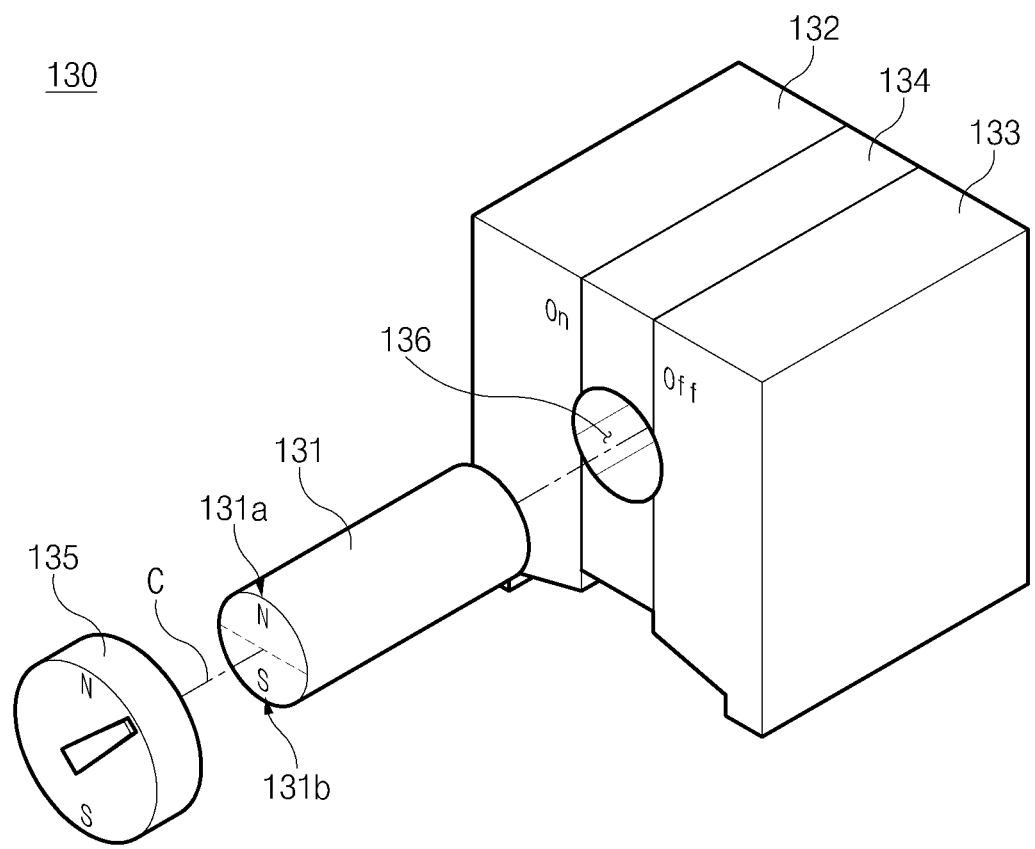
FIG. 5 is an exploded perspective view of the magnetic force generator in the fixing device for the secondary battery test according to an embodiment of the present invention.

FIG. 4 is a perspective view of the magnetic force generator in the fixing device for the secondary battery test according to an embodiment of the present invention, and FIG. 5 is an exploded perspective view of the magnetic force generator in the fixing device for the secondary battery test according to an embodiment of the present invention.

Figure 6:
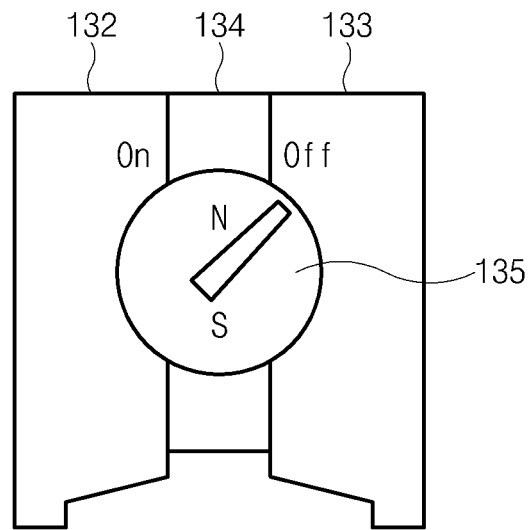
FIG. 6 is a front view illustrating a state in which magnetism of the magnetic force generator is turned off in the fixing device for the secondary battery test according to an embodiment of the present invention.
Figure 7:
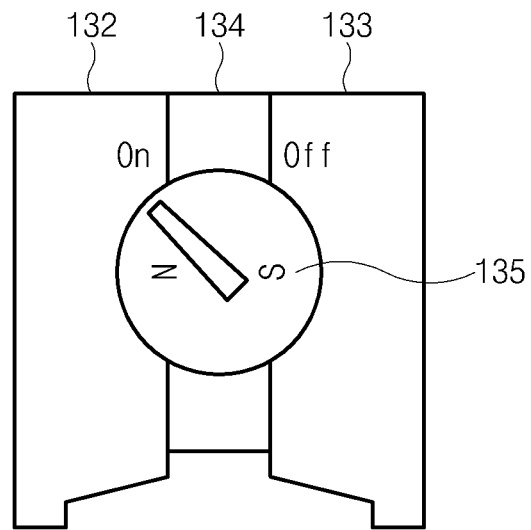
FIG. 7 is a front view illustrating a state in which the magnetism of the magnetic force generator is turned on in the fixing device for the secondary battery test according to an embodiment of the present invention.

FIG. 6 is a front view illustrating a state in which magnetism of the magnetic force generator 130 is turned off in the fixing device 100 for the secondary battery test according to an embodiment of the present invention, and FIG. 7 is a front view illustrating a state in which the magnetism of the magnetic force generator 130 is turned on in the fixing device 100 for the secondary battery test according to an embodiment of the present invention.

Referring to FIGS. 3 to 5, the magnetic force generator 130 may provide the magnetic force to the seating stage 110 and the cover 120. Here, attractive magnetic force may be generated between the cover 120 and the seating stage 110, which receive the magnetic force from the magnetic force generator 130 to fix the secondary battery 10 disposed between the cover 120 and the seating stage 110 without moving.

Also, the magnetic force generator 130 may have one side seated on the seating stage 110 and the other side on which the cover 120 is disposed to be vertically movable. Thus, the magnetic force generated in the magnetic force generator 130 may be transmitted to the seating stage 110 and the cover 120.

Furthermore, the magnetic force generator 130 may comprise a pair of ferromagnetic blocks 132 and 133, a cylindrical permanent magnet 131 rotatably provided between the pair of ferromagnetic blocks 132 and 133, and a non-magnetic block 134 disposed between the pair of ferromagnetic blocks 132 and 133 to rotatably support the cylindrical permanent magnet 131. Also, the magnetic force generator 130 may further comprise an adjustment part 135 on an end of the cylindrical permanent magnet 131.

The ferromagnetic blocks 132 and 133 may be provided in a pair and thus disposed on both sides of the non-magnetic block 134. Each of the ferromagnetic blocks 132 and 133 may be made of one or more of Fe, Ni, and Co.

The non-magnetic block 134 may be made of one or more of aluminum (Al), copper (Cu), and gold (Au).

Both sides of the cylindrical permanent magnet 131 in a lateral direction of a rotation axis C thereof may respectively have magnetism of an N pole and an S pole, which have opposite polarities, and which extend along the rotation axis.

Here, as the cylindrical permanent magnet 131 rotates, the magnetism of the magnetic force generator 130 may be turned on/off.

A mounting hole 136 may be formed so that the cylindrical permanent magnet 131 is rotatably mounted in the non-magnetic block 134 and the pair of ferromagnetic blocks 132 and 133. Here, the mounting hole 136 may have a shape corresponding to that of the cylindrical permanent magnet 131. Here, the cylindrical permanent magnet 131 may rotate along an inner wall of the mounting hole 136 so that both sides of the cylindrical permanent magnet 131 alternately face the non-magnetic block 134 and the pair of ferromagnetic blocks 132 and 133.

The adjustment part 135 may be disposed on an end of the cylindrical permanent magnet 131 and also disposed outside the mounting hole 136. Here, the cylindrical permanent magnet 131 may equally rotate as the adjustment part 135 rotates.

Here, since the adjustment part 135 rotates to allow the cylindrical permanent magnet 131 to rotate, the magnetism of the magnetic force generator 130 may be easily turned on/off.

Referring to FIGS. 5 and 6, since the adjustment part 135 rotates to allow the cylindrical permanent magnet 131 to rotate, when each of ends 131a and 132b of the N pole and the S pole of the cylindrical permanent magnet 131 is disposed to face the non-magnetic block 134, the magnetism of the magnetic force generator 130 may be turned off.

Referring to FIGS. 5 and 7, since the adjustment part 135 rotates to allow the cylindrical permanent magnet 131 to rotate, when each of ends 131a and 132b of the N pole and the S pole of the cylindrical permanent magnet 131 is disposed to face the pair of ferromagnetic blocks 132 and 133, the magnetism of the magnetic force generator 130 may be turned on.

Thus, referring to FIGS. 2, 5, and 7, for example, when the nail penetration test of the secondary battery 10 to be tested is performed, before a nail 21 passes through the secondary battery 10 by using a nail penetration device 20, the ends 131a and 131b of the N pole and the S pole of the cylindrical permanent magnet 131 are respectively disposed to face the pair of ferromagnetic blocks 132 and 133 so that the magnetism of the magnetic force generator 130 is turned on to fix the secondary battery 10 through the cover 120 and the seating stage 110. Here, magnetic force may be generated in a direction in which the cover 120 and the seating stage 110 are attractive to each other to fix the secondary battery 10. Thus, when the nail 21 passes through the secondary battery 10, the secondary battery may be fixed without moving.

Referring to FIGS. 2 and 3, the cover 120 may be vertically movably coupled to the magnetic force generator 130 through the vertical moving unit 160.

Also, the cover 120 may be vertically movably coupled to the magnetic force generator 130 through the vertical moving unit 160.

Also, the vertical moving unit 160 may comprise a guide part 150 fixed to the magnetic force generator 130 and a movable block 140 coupled to the guide part 150.

A guide protrusion 151 may protrude from the guide part 150. Here, the guide protrusion 151 may protrude in a direction in which the movable block 140 is disposed.

The movable block 140 may have one side that is vertically movably coupled to the guide part 150 and the other side to which the cover 120 is fixed.

Also, the movable block 140 may have a guide hole 141, into which the guide protrusion 151 is inserted, in a vertical direction. Thus, the movable block 140 may vertically move by being guided by the guide protrusion 151.

The guide protrusion 151 may comprise a body 151b disposed in the guide hole 141 and an end 151a protruding to the outside of the guide hole 141. Here, the end 151a of the guide protrusion 151 may have a size greater than that of the guide hole 141 to prevent the movable block 140 from being separated from the guide part 150.

Here, the movable block 140 may comprise an accommodation part 142 along an edge of the guide hole 141 so that the end 151a of the guide protrusion 151 is accommodated. That is, a stepped portion may be formed along the edge of the guide hole 141 of the movable block 140 to provide an accommodation part 142 into which the end 151a of the guide protrusion 151 is accommodated. Here, the accommodation part 142 into which the end 151a of the guide protrusion 151 is accommodated may have a width corresponding to that of the end 151a of the guide protrusion 151.

Also, the width of the guide hole 141 may correspond to that of the body 151b of the guide protrusion 151.

The fixing device 100 for the secondary battery according to an embodiment of the present invention may fix the secondary battery 10 disposed between the cover 120 and the seating stage 110 through the attractive magnetic force between the cover 120 and the seating stage 110, which receive the magnetic force from the magnetic force generator 130. Thus, when the nail penetration test is performed, movement such as lifting of the secondary battery 10 may be suppressed when the nail 21 passes through the secondary battery 10 to prevent secondary short circuit from occurring. That is, when the test in which the nail 21 passes through the secondary battery 10 is performed, the secondary battery 10 may be shaken by an impact to cause the secondary short circuit, thereby significantly deteriorating the reliability with respect to results of the test.

Embodiment 1

A secondary battery was fixed by using a fixing device comprising a seating stage provided as a magnetic body, a cover provided as a magnetic body and covering the secondary battery, and a magnetic force generator, and then, a nail penetration test of the secondary battery was performed.

Comparative Example 1

The test conditions (variables) are the same as Embodiment 1, except that there is no separate fixing device for fixing the secondary battery.

Experimental Example

Results obtained by performing the nail penetration test on the secondary battery were analyzed to be shown in Table 1. When the nail penetration test is performed, a charged state was SOC 100%, and a penetration speed was 1 m/min. Also, a dependent variable is presence or absence of the fixing device for fixing the secondary battery.

TABLE 1

| | Ignition Number (Total test number) | Ignition rate |
|---|---|---|
| Embodiment 1 | 3 (7) | 43% |
| Comparative Example 1 | 6 (7) | 86% |

As shown in Table 1, it is observed that an ignition rate is significantly reduced in Embodiment 1 as compared with Comparative Example 1. In more detail, when a nail penetration test is performed on a secondary battery fixed by attractive magnetic force between a cover and a seating stage through a magnetic force generator, an ignition rate is 43%, and when the nail penetration test is performed without fixing the secondary battery according to Comparative Example 1 by using a separate fixing device, it is seen that an ignition rate significantly increases to 86%. That is, it is seen that secondary ignition occurs when the nail penetration test is performed on the secondary battery according to Comparative Example 1 without fixing the secondary battery. As a result, when the nail penetration test is performed on the secondary battery 10 by using the fixing device for the secondary battery test according to Embodiment 1, it is seen that the nail penetration test is significantly improved in reliability because the secondary battery 10 is fixed without moving.

Figure 8:
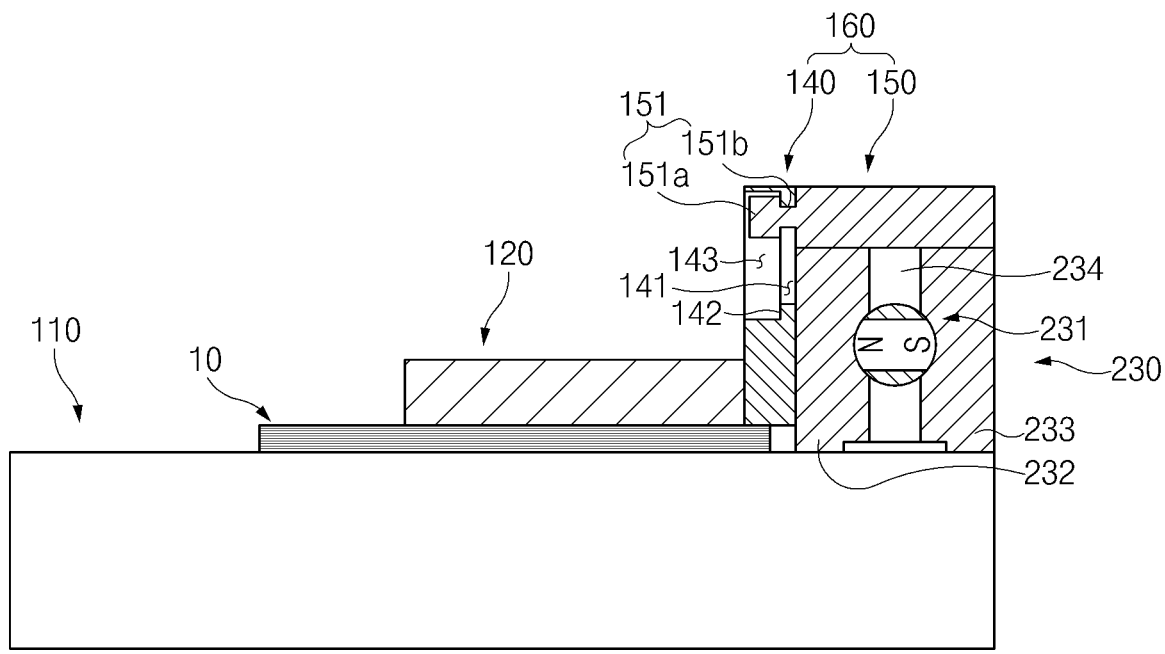
FIG. 8 is a cross-sectional view of a fixing device for a secondary battery test according to another embodiment of the present invention.
Figure 9:
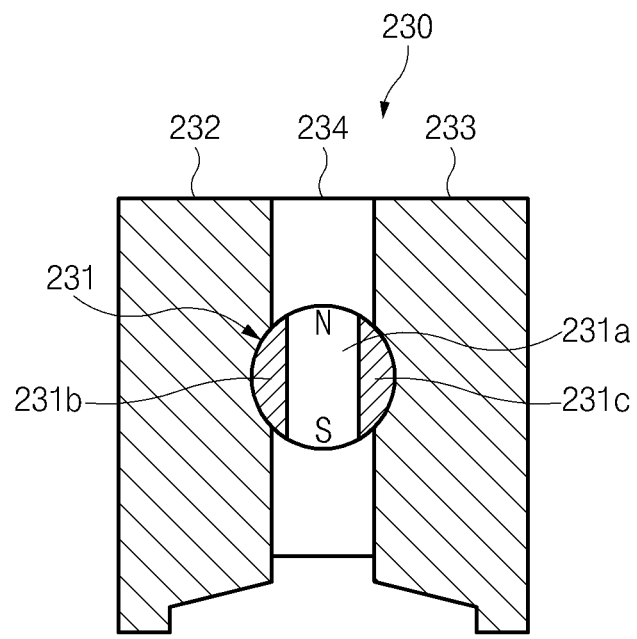
FIG. 9 is a cross-sectional view of a magnetic force generator in the fixing device for the secondary battery test according to another embodiment of the present invention.

FIG. 8 is a cross-sectional view of a fixing device for a secondary battery test according to another embodiment of the present invention, and FIG. 9 is a cross-sectional view of a magnetic force generator in the fixing device for the secondary battery test according to another embodiment of the present invention.

Referring to FIGS. 8 and 9, a fixed device 200 for a secondary battery test according to an embodiment of the present invention may comprise a seating stage 110 on which a secondary battery 10 is seated, a cover 120 covering the secondary battery 10, a magnetic force generator 230 providing magnetic force to the seating stage 110 and cover 120, and a moving unit 160 for allowing the cover 120 to be coupled to be vertically movable. Here, the fixing device 200 for the secondary battery test according to another embodiment of the present invention may comprise non-magnetic bodies 231b and 231c disposed on both sides of a cylindrical permanent magnet 231 of the magnetic force generator 230.

That is, the fixing device 200 for the secondary battery test according to another embodiment of the present invention is different in the configuration of the cylindrical permanent magnet 231 from the fixing device 100 for the secondary battery test according to the foregoing embodiment. Thus, contents of this embodiment, which are duplicated with those according to the forgoing embodiment, will be briefly described, and also, differences therebetween will be mainly described.

In more detail, in the fixing device 200 for the secondary battery test according to another embodiment of the present invention, the magnetic force generator 230 may comprise a pair of ferromagnetic blocks 232 and 233, a cylindrical permanent magnet 231 rotatably provided between the pair of ferromagnetic blocks 232 and 233, and a non-magnetic block 234 disposed between the pair of ferromagnetic blocks 232 and 233 to rotatably support the cylindrical permanent magnet 231.

Both sides of the cylindrical permanent magnet 231 in a lateral direction of a rotation axis C thereof may respectively have magnetism of an N pole and an S pole, which have opposite polarities. Here, the cylindrical permanent magnet 231 may be divided into, for example, three parts. Thus, a permanent magnet 231a may be disposed at a central portion of the cylindrical permanent magnet 231, and the non-magnetic bodies 231b and 231c may be respectively disposed on both sides of the permanent magnet 231a. Thus, when the N and S poles of the permanent magnet 231a are disposed to face the non-magnetic bodies 231b and 231c, the non-magnetic bodies 231b and 231c disposed on both sides of the permanent magnet 231a may face ferromagnetic blocks 232 and 233. As a result, in a state in which magnetism of the magnetic force generator 230 in which the N and S poles of the permanent magnet 231a face the non-magnetic blocks 234 is turned off, a more complete non-magnetic state may be easily formed.

While the present invention has been particularly shown and described with reference to exemplary embodiments thereof, the fixing device for the secondary battery test according to the present invention is not limited thereto. It will be understood by those of ordinary skill in the art that various changes in form and details may be made therein without departing from the spirit and scope of the invention.

Furthermore, the scope of protection of the present invention will be clarified by the appended claims.

The invention claimed is:

1. A fixing device for a secondary battery test, the fixing device comprising:
   a seating stage configured to seat a secondary battery to be tested, the seating stage being a magnetic body;
   a cover configured to cover the secondary battery when seated on the seating stage, the cover being a magnetic body; and
   a magnetic force generator providing magnetic force to the seating stage and the cover,
   wherein, when the magnetic force is transmitted from the magnetic force generator to the seating stage and the cover, attractive magnetic force is generated between the cover and the seating stage such that the cover and the seating stage are capable of fixing the secondary battery disposed between the cover and the seating stage such that the secondary battery does not move relative to the seating stage,
   wherein the magnetic force generator comprises:
      a pair of ferromagnetic blocks; and
      a cylindrical permanent magnet rotatably provided between the pair of ferromagnetic blocks, and
   wherein, as the cylindrical permanent magnet rotates, magnetism of the magnetic force generator is turned on/off.

2. The fixing device of claim 1, wherein the magnetic force generator comprises a non-magnetic block disposed between the pair of ferromagnetic blocks, the non-magnetic block being configured to rotatably support the cylindrical permanent magnet.

3. The fixing device of claim 2, wherein the magnetic force generator comprises a mounting hole defined by the pair of ferromagnetic blocks and non-magnetic block, and
   wherein the cylindrical permanent magnet is rotatably mounted in the mounting hole, and
   wherein, as the cylindrical permanent magnet rotates, both sides of the cylindrical permanent magnet alternately face the non-magnetic block and the pair of ferromagnetic blocks.

4. The fixing device of claim 2, wherein the cylindrical permanent magnet includes a N pole and a S pole extending along a rotation axis of the cylindrical permanent magnet.

5. The fixing device of claim 2, wherein, as the cylindrical permanent magnet rotates, when each of ends of N and S poles of the cylindrical permanent magnet is disposed to face the non-magnetic block, the magnetism of the magnetic force generator is turned off, and
   when the ends of the N and S poles of the cylindrical permanent magnet are respectively disposed to face the pair of ferromagnetic blocks, the magnetism of the magnetic force generator is turned on.

6. The fixing device of claim 1, wherein each of the ferromagnetic blocks comprises one or more of Fe, Ni, and Co.

7. The fixing device of claim 2, wherein the non-magnetic block comprises one or more of Al, Cu, and Au.

8. The fixing device of claim 1, wherein each of the seating stage and the cover is a ferromagnetic body made of a metal material.

9. The fixing device of claim 8, wherein each of the seating stage and the cover comprises one or more of Fe, Ni, and Co.

10. The fixing device of claim 1, wherein the magnetic force generator has one side seated on the seating stage and another side on which the cover is arranged to be vertically movable and to transmit the magnetic force generated in the magnetic force generation part to the seating stage and the cover.

11. The fixing device of claim 1, further comprising:
a guide part fixed to the magnetic force generator; and
a movable block having one side vertically movably coupled to the guide part and another side to which the cover is fixed.

12. The fixing device of claim 11, wherein a guide protrusion is disposed on the guide part, and
the movable block has a guide hole, into which the guide protrusion is inserted, in a vertical direction so as to be vertically movable by being guided by the guide protrusion.

13. The fixing device of claim 12, wherein an end of the guide protrusion has a size greater than a width of the guide hole to prevent the movable block from being separated from the guide part.

14. The fixing device of claim 13, wherein the movable block comprises an accommodation part along an edge of the guide hole so that the end of the guide protrusion is accommodated therein.

15. The fixing device of claim 1, wherein the cylindrical permanent magnet includes a pair of non-magnetic bodies arranged on opposite sides of a permanent magnet.

16. A fixing device for a secondary battery test, the fixing device comprising:
a seating stage configured to seat a secondary battery to be tested, the seating stage being a magnetic body;
a cover configured to cover the secondary battery when seated on the seating stage, the cover being a magnetic body;
a magnetic force generator providing magnetic force to the seating stage and the cover,
a guide part fixed to the magnetic force generator; and
a movable block having one side vertically movably coupled to the guide part and another side to which the cover is fixed,
wherein, when the magnetic force is transmitted from the magnetic force generator to the seating stage and the cover, attractive magnetic force is generated between the cover and the seating stage such that the cover and the seating stage are capable of fixing the secondary battery disposed between the cover and the seating stage such that the secondary battery does not move relative to the seating stage.

17. The fixing device of claim 16, wherein a guide protrusion is disposed on the guide part, and
the movable block has a guide hole, into which the guide protrusion is inserted, in a vertical direction so as to be vertically movable by being guided by the guide protrusion.

18. The fixing device of claim 17, wherein an end of the guide protrusion has a size greater than a width of the guide hole to prevent the movable block from being separated from the guide part.

19. The fixing device of claim 18, wherein the movable block comprises an accommodation part along an edge of the guide hole so that the end of the guide protrusion is accommodated therein.

* * * * *